(12) United States Patent
Hentz et al.

(10) Patent No.: US 8,947,176 B2
(45) Date of Patent: Feb. 3, 2015

(54) ELECTROMECHANICAL RESONATOR WITH RESONANT ANCHOR

(75) Inventors: Sebastien Hentz, Varces Allieres et Risset (FR); Julien Arcamone, St. Martin le Vinoux (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 489 days.

(21) Appl. No.: 13/375,627

(22) PCT Filed: Jun. 7, 2010

(86) PCT No.: PCT/EP2010/057928
§ 371 (c)(1),
(2), (4) Date: Dec. 1, 2011

(87) PCT Pub. No.: WO2010/142643
PCT Pub. Date: Dec. 16, 2010

(65) Prior Publication Data
US 2012/0092082 A1 Apr. 19, 2012

(30) Foreign Application Priority Data

Jun. 9, 2009 (FR) .................................... 09 53820

(51) Int. Cl.
*H03H 9/24* (2006.01)
*H03H 9/50* (2006.01)
(Continued)

(52) U.S. Cl.
CPC ......... *H03H 9/02338* (2013.01); *H03H 3/0072* (2013.01); *H03H 2009/2442* (2013.01);
(Continued)

(58) Field of Classification Search
CPC ............ H03H 9/02338; H03H 9/2405; H03H 9/2431; H03H 9/2436; H03H 9/2447; H03H 9/485; H03H 9/505; H03H 3/007; H03H 3/0072; H03H 2009/0244; H03H 2009/02251; H03H 2009/02346; H03H 2009/02496; H03H 2009/02503; H03H 2009/02527; H03H 2009/2442; H03H 2009/02385; B81B 2203/0307

USPC ................ 333/186; 257/414, 415; 438/48, 50
See application file for complete search history.

(56) References Cited

U.S. PATENT DOCUMENTS 5,095,763 A      3/1992   Delatorre ................... 73/862.59
7,323,952 B2 *   1/2008   Pan et al. ...................... 333/186
(Continued)

FOREIGN PATENT DOCUMENTS

FR       2 876 180 A1       4/2006
WO    WO 2004/092745 A1    10/2004
WO    WO 2006/124303 A1    11/2006

OTHER PUBLICATIONS

L. Khine et al.; "12.9MHz Lame-Mode Differential SOI Bulk Resonators"; Transducers and Eurosensors 2007, The 14th International Conference on Solid-State Sensors, Actuators and Microsystems, Lyon, France, Jun. 10-14, 2007, pp. 1753-1756.*

(Continued)

*Primary Examiner* — Barbara Summons
(74) *Attorney, Agent, or Firm* — Oblon, Spivak, McClelland, Maier & Neustadt, L.L.P.

(57) ABSTRACT

An electromechanical resonator produced on a substrate, and a method of producing thereof, including: a suspended structure produced at least partly from the substrate, configured to have a vibration imparted to it such that it resonates at least one natural resonance frequency of the suspended structure; an anchor structure to anchor the suspended structure, by at least one area of its periphery, to the remainder of the substrate, and dimensioned to resonate at the resonance frequency; a mechanism to excite the suspended structure, to cause it to vibrate at the resonance frequency; and a mechanism to detect the vibration frequency of the suspended structure.

6 Claims, 8 Drawing Sheets

(51) Int. Cl.
H03H 9/02 (2006.01)
H03H 3/007 (2006.01)
(52) U.S. Cl.
CPC ............. H03H2009/0244 (2013.01); H03H 2009/02385 (2013.01); H03H 9/2436 (2013.01); H03H 2009/02503 (2013.01); H03H 2009/02527 (2013.01)
USPC .......................... 333/186; 257/415; 438/48

(56) References Cited

U.S. PATENT DOCUMENTS

| | | | |
|---|---|---|---|
| 7,777,596 B2* | 8/2010 | Lutz et al. ............ | 333/186 |
| 7,990,232 B1* | 8/2011 | Lee ..................... | 333/186 |
| 2003/0117237 A1* | 6/2003 | Niu et al. ............. | 333/187 |
| 2005/0174197 A1* | 8/2005 | Nguyen et al. ....... | 333/186 |
| 2006/0071578 A1 | 4/2006 | Drabe et al. ......... | 310/309 |
| 2007/0001783 A1 | 1/2007 | Lutz et al. ........... | 333/186 |
| 2007/0046398 A1* | 3/2007 | Nguyen et al. ....... | 333/186 |
| 2007/0052498 A1 | 3/2007 | Pan et al. ............. | 333/186 |
| 2008/0165403 A1 | 7/2008 | Grasshoff et al. .... | 359/199 |
| 2008/0218295 A1 | 9/2008 | Lutz et al. ........... | 333/186 |
| 2009/0153267 A1 | 6/2009 | Lutz et al. ........... | 333/186 |
| 2009/0249873 A1 | 10/2009 | Delevoye ............. | 73/504.12 |
| 2010/0314969 A1* | 12/2010 | Gaidarzhy et al. ... | 310/321 |
| 2011/0221301 A1 | 9/2011 | Hentz et al. ......... | 310/309 |

OTHER PUBLICATIONS

L. Khine et al.; "7MHz Length-Extensional SOI Resonators With T-Shaped Anchors"; Transducers 2009, International Conference on Solid-State Sensors, Actuators and Microsystems, Denver, CO, USA, Jun. 21-25, 2009, pp. 1441-1444.*

J. E-Y. Lee et al.; "Quality Factor Enhancement of Bulk Acoustic Resonators Through Anchor Geometry Design"; 4 pages, published in Proceedings of Eurosensors XXII, Dresden, Germany, Sep. 7-10, 2008, pp. 536-539.*

Department of Engineering, University of Cambridge list of publications provided online at http://www2.eng.cam.ac.uk/-aas41/publications.html, including at item 95 the full citation of "Quality Factor Enhancement of Bulk Acoustic Resonators Through Anchor Geometry Design" Sep. 7-10, 2008, one page.*

Preliminary Search Report issued Oct. 7, 2009, in French Patent Application No. FR 0953820.

L. Khine, et al., "High-$Q$ bulk-mode SOI square resonators with straight-beam anchors", Journal of Micromechanics and Microengineering, vol. 19, No. 1, 2009, pp. 1-10, published Nov. 28, 2008.

Yuan Xie, et al., "1.52-GHz Micromechanical Extensional Wine-Glass Mode Ring Resonators", IEEE Transactions on Ultrasonics, Ferroelectrics, and Frequency Control, vol. 55, No. 4, XP 11208121, Apr. 2008, pp. 890-907.

Raffi Kamalian, et al., "Improving Evolutionary Synthesis of MEMS through Fabrication and Testing Feedback", Systems, Man and Cybernetics, 2005 IEEE, vol. 2, XP 10873945, Oct. 10, 2005, pp. 1908-1913.

Jordi Teva Merono, "Integration of CMOS-MEMS resonators for radiofrequency applications in the VHF and UHF bands", http://www.tesisenxarxa.net/TDX/TDX_UAB/TESIS/AVAILABLE/TDX-1102107-092623/jtmldel.pdf; XP 2601847, Jul. 4, 2007, pp. 43-47, 170-171.

* cited by examiner

ELECTROMECHANICAL RESONATOR WITH RESONANT ANCHOR

TECHNICAL FIELD

The invention relates to an integrated electromechanical resonator on a substrate. The mobile portion of the resonator, i.e. the suspended portion, is connected to the fixed portion (the remainder of the substrate) by anchors which are resonant according to the invention. Generally, such resonators can be used as an oscillating structure for a time base, notably in the field of microcomputing, mobile telephony and other mobile devices. They can also be used to produce resonant sensors, in particular for mass sensors, gas sensors or biological sensors.

STATE OF THE PRIOR ART

All current microelectronic circuits require a clock in order to operate. This clock consists of an oscillator and its associated electronics. The oscillator is a mechanical structure, called a resonator, which is kept vibrating in one of its natural modes, and fed back to itself via the associated electronics by virtue of actuation and detection means, generating by this means a signal with a very stable frequency. In a large majority of cases this oscillator is a piece of monocrystalline quartz, excited at its natural frequency often piezoelectrically. This combination offers the advantage of quartz's great frequency stability, which is due to a very limited phase noise, and of easy reading. In addition, particular cutting directions of the quartz crystal provide an extremely low temperature dependency of the generated frequency. Conversely, quartz components are subject to a prohibitive fault: they are not "integrable", i.e. the method by which they are produced is not compatible with collective microelectronic methods, requiring that they are manufactured separately from the CMOS circuit, and consequently substantially increasing the cost and size of the component. Another significant disadvantage of quartz for its use in energy self-sufficient on-board systems is its substantial power consumption.

For this reason, its replacement by integrable devices is an extremely active field of research (both academic and industrial), and certain companies are even beginning to offer commercial products for certain applications. Research has naturally turned to silicon structures, firstly for evident integration-related reasons. But silicon is also a potentially very advantageous material from a phase noise standpoint, and therefore in terms of frequency stability. This phase noise is inversely proportional to the deformation energy to which the structure may be subject. And the energy density of silicon is substantially higher than that of quartz, making it a material of great interest: for example, with comparable volume modes this density is $1.9*10^2$ J·m$^{-3}$ in the case of quartz and $1.8*10^5$ J·m$^{-3}$ in the case of silicon.

Conversely, silicon devices are not yet capable of achieving the desired performance specifications for certain applications in terms of frequency stability, since the latter depends very greatly on the transduction gain of the structure's resonance. Almost all the devices are in the literature propose a capacitive transduction, the gain of which depends very greatly on the capacitive gap g, and on the stiffness of the structure k and on its frequency $f_\varphi$. The phase noise density $B_\varphi$ can then be written as follows:

$$B_\phi(f_m) = 10\log\left(\frac{Fk_BT}{P_0}\left(1+\frac{f_0^2}{2f_m^2}\frac{1}{Q^2}\right)\left(1+\frac{f_C}{f_m}\right)\right) \text{ where } \frac{Fk_BT}{P_0} \propto \frac{g^2}{kf_0}k_BT$$

where:
$f_m$=frequential shift relative to the carrier
F=noise factor of the electronics
$k_B$=Boltzmann's constant
T=temperature
$P_o$=power transmitted in the resonator
Q=quality factor
$f_c$=transmission frequency between the close carrier noise and the noise floor In order to satisfy the desired performance specifications, it is therefore of primordial importance to obtain very stiff structures (where k is high), whilst favouring movement of them relative to the gap, i.e. it is also of primordial importance to reduce this transduction gap g and to obtain as large as possible a quality factor Q.

The scientific literature contains several types of resonator manufactured using silicon.

There are ring-shaped structures which are anchored in the centre, of the type known as "SiTime" (from the name of the company SiTime Corporation). Reference may be made to this subject at the website www.sitime.com.

The article "Square-Extensional Mode Single-Crystal Silicon Micromechanical Resonator for Low-Phase-Noise Oscillator Applications" by V. Kaajakari, IEEE Electron Devices Letters, vol. 25, no 4, April 2004, pages 173 to 175, discloses a resonator manufactured from a square plate.

Article "60 MHz wine-glass micromechanical-disk reference oscillator", by Yu-Wei Lin et al., ISSCC, Digest of Technical Papers, 530, 15-19 Feb. 2004, pages 322 and 323, discloses a resonator including a disk with two external (lateral) anchors in the mode known as "wine-glass".

The article "A low phase noise 100 MHz silicon BAW reference oscillator" by K. Sundaresan et al., IEEE CICC, 10-13 Sep. 2006, pages 841 to 844, discloses a resonator formed from a rectangular plate with external anchors.

The plates and discs including external anchors or anchors in their centre can be used in their Lamé mode, "wine-glass" mode or extensional mode, or in other modes, such as modes of higher orders.

As stipulated above, it is important to optimise the quality factor in order to obtain improved phase noises. The quality factor characterises energy losses or dissipation, which have several sources:
the fundamental limit, thermoelastic dissipation, "material" damping,
losses in the media (acoustic propagation in the medium leading to dissipation of the wave in the substrate or the device's support),
surface losses,
viscous losses (air damping), which it is possible to reduce, or even eliminate, by encapsulating the device in a vacuum.

At the sizes considered, and when working in a low-pressure context, the losses in the supports and the thermoelastic dissipation are predominant. Since the second of these is a fundamental limit, all measures must be taken to reduce the losses in the supports, whilst favouring the structure's movement. To this end, the literature has only very few solutions. Some of these use a single anchor located under the structure and at its centre, when the latter is a nodal point. This is a favourable solution from a performance standpoint, but one which unfortunately requires the use of a complex manufacturing method, since additional steps and levels of lithography are required to obtain this central anchor. The other devices use anchors which are external (lateral) to the structure, but this hinders its movement, even minimally.

In the case of lateral anchors, few solutions are given to minimise this movement resistance. For example, in the case of a plate in extensional mode, some propose a transverse bar used as a deflecting spring to reduce the stiffness of the anchor. But the stiffness of the anchors cannot be reduced too substantially for reasons of robustness (adhesion of the structure when it is released or subject to an impact). Others position the anchors at the nodal points (the point where the mode's displacement field is zero) of the structure's natural mode. The ideal case requires perfectly localised anchors, which in practice are impossible to produce. In all cases resistance to movement therefore remains.

It is therefore necessary to find new solutions to reduce the acoustic loss at the anchors, and to hinder the movement of the structure as little as possible.

The document "High-Q bulk-mode SOI square resonators with straight-beam anchors" by L. Khine et al., J. Micromech. Microeng., Vol. 19, No 1, 1 Jan. 2009, 015017, discloses resonant anchor structures for the wine-glass and Lamé modes. These anchor structures consist of a single beam, one end of which is connected to the resonant structure, used with a particular deflection mode. The uncoupling obtained (between the substrate's mechanical support and allowance of amplitude movements of sufficient vibration) is not particularly effective.

SUMMARY OF THE INVENTION

The idea on which the invention is based is:

1) proposing external (lateral) anchors in order to continue to use as simple as possible a manufacturing method, 2) use of stiff anchors in order to obtain robust structures, 3) at the same time, favouring the movement of the structure, and also great mismatch of acoustic impedance between the structure and anchors in order to minimise the loss in the anchors. Acoustic impedance characterises the resistance which a medium opposes to its being moved when it is traversed by an acoustic wave. It is defined as the ratio of the acoustic pressure over the local speed of displacement in a medium. When an acoustic wave encounters the interface separating two different acoustic impedance media, a portion of the wave is transmitted into the other medium, whereas another portion is reflected from the interface. The notion of acoustic impedance enables this phenomenon to be studied completely and quantitatively, and also enables the quantities of acoustic energy transmitted and reflected to be estimated. In the case of the invention the aim is to minimise the transmitted energy. A great mismatch may be obtained by suddenly changing the transverse dimensions, or by using different materials.

To respond to these three requirements, it is proposed to use anchors which resonate equally with a mode at the same resonance frequency as the structure considered. Thus, their static stiffness may be substantial, but their movement is amplified by a ratio equal to the quality factor of their resonance, which may potentially be substantial.

A large number of resonant anchors may be imagined, since the photolithography methods enable any shape to be defined in the plane. These anchors are also valid for every type of resonant structure, advantageously with a mode in the plane, but also outside the plane. These anchors require no specific excitation, since the acoustic coupling with the principal structure will be sufficient to excite them.

The two modes of energy losses, and therefore of degradation of the quality factor, are the losses in the anchors and the thermoelastic losses. In order to limit the former, the anchors can be positioned on the substrate at the nodal points of the structure's used resonance mode, or conversely movement of the anchor points of the resonant structure can be facilitated, i.e. anchor structures of low effective stiffness can be used in order to subject the substrate to the least possible stress, giving rise to the idea of resonant anchors.

An extensional mode comprises only a single nodal point, at the centre of the structure. A central anchor under the structure would impose great constraints on the manufacturing method, in terms of complexity and alignment of the different levels. The aim will therefore be rather to seek to favour movement of the structure's anchor points at its edge, i.e. where movement is greatest. The wine-glass (disk) and Lamé (square) modes, conversely, have several nodal points at their edge, which may be the structure's anchor points. In both cases it is advantageous to use lateral anchors, which gives greater freedom for the design of these anchors, and which can therefore be resonant anchors.

A first object of the invention consists in an electromechanical resonator produced on a substrate, including:

a suspended structure produced at least partly from the substrate, intended to have a vibration imparted to it such that it resonates at least one natural resonance frequency of the suspended structure, an anchor structure to anchor the suspended structure, by at least one area of its periphery, to the remainder of the substrate, where the anchor structure is dimensioned in order to resonate at said resonance frequency, or at a frequency which is a multiple of the resonance frequency, means of excitation of the suspended structure, to cause it to vibrate at said resonance frequency, means of detection of the vibration frequency of the suspended structure, characterised in that:

the anchor structure includes at least one T-shaped element formed from a first fixed-fixed beam, coupled with the substrate, and a second beam, a first end of which is coupled with the first beam, and a second end of which is coupled with the suspended structure, if the suspended structure resonates in Lamé mode or in wine-glass mode the first end of the second beam is coupled with the first beam at a node of vibration of the first beam, and the second end of the second beam is coupled with the suspended structure at a nodal point of the latter, if the suspended structure resonates in extensional mode the first end of the second beam is coupled with the first beam at a point forming a vibration antinode of the first beam, and the second end of the second beam is coupled with the suspended structure at a point of maximum displacement of the vibrating suspended structure.

The anchor structure may be made entirely or partly of the substrate, or from an element deposited on the latter.

The suspended structure may be a structure chosen from among a disk, a square plate, a rectangular plate, a ring or an ellipse. This may be a disk or an ellipse resonating in extensional mode, or a disk or an ellipse resonating in "Wine-Glass" mode. It may be a square or rectangular plate resonating in extensional mode, or a plate resonating in its Lamé mode.

The length of the second beam may be between 0 and half the length of the first beam.

A second object of the invention consists in a method to produce an electromechanical resonator as defined above, and intended to operate at a given resonance frequency, including the following steps:
- selecting the shape of the suspended structure,
- selecting the dimensions of the suspended structure in order that one of its natural modes is the given resonance frequency,
- selecting the shape and position of the anchor structure intended to resonate at the given resonance frequency,
- modelling of the suspended structure and of the anchor structure, in order to determine the dimensions of the anchor structure considered, in order that both the structures may resonate at the same frequency,
- manufacture of the resonator using the data supplied in the previous steps.

BRIEF DESCRIPTION OF THE ILLUSTRATIONS

The invention will be better understood and other advantages and features will appear on reading the following description, which is given as a non-restrictive example, accompanied by the appended illustrations, among which.

DETAILED ACCOUNT OF PREFERRED EMBODIMENTS

Generally, the oscillator according to the present invention includes the resonant structure proper generating the clock frequency, and an anchor structure which it is sought to cause to resonate at the same frequency as the resonant structure. The method of design of the resonator may be as follows:
- choice of the frequency of the clock signal to be generated,
- choice of the shape of the suspended structure (square, circular, ring-shaped, any shape, etc.),
- choice of the dimensions of the suspended structure in order that one of its natural modes is the chosen frequency,
- subsequent choice of the shape and position of the anchor structure which is to be made to resonate at the same frequency as the suspended structure,
- modelling of the suspended structure and of the anchor structure, to determine the dimensions of the anchor structure considered, in order that both structures may resonate at the same frequency.

Except in the case of very specific shapes and modes, the suspended structure must be modelled in a computer application in order to determine the dimensions precisely. The skilled man in the art can use a structural simulation application such as, for example, those available from the companies Comsol, Ansys and Abaqus, enabling the appropriate geometrical dimensions to be determined in order to obtain a given resonance frequency for a given shape and a given material.

The shape of the anchor structure may be chosen so as to maximise the acoustic mismatch, to favour simplicity of the manufacturing method, to favour movement of the suspended structure, etc. Its dimensioning may be determined by one of the applications mentioned above.

It is possible that the frequency of the suspended structure may be slightly modified compared to the modelling through the addition of resonant anchors. This requires that there is a correction of its dimensions, and also requires iteration in order to find the correct dimensions of the suspended structure and of the anchor structure.

Several embodiments of the present invention will now be described. For the sake of simplicity the case of a suspended structure of square or circular shape will be used, bearing in mind that the skilled man in the art may apply this principle in the same manner to other suspended structure shapes.

1) A Disk or Square Plate Resonating in Extensional Mode with Anchors Resonating in their Longitudinal Mode In the case of a square plate, the frequency $f_{EXT\_P}$ of the extensional mode is:

$$f_{EXT\_P} = \frac{1}{2L}\sqrt{\frac{E_{2D}}{\rho}} \quad (1)$$

where L is the length of the side of the plate, and $\rho$ and $E_{2D}$ are, respectively, the density and the effective biaxial Young's modulus of the material constituting the plate for the vibration direction considered. Reference may be made on this subject to the article "Square-Extensional Mode Single-Crystal Silicon Micromechanical Resonator for Low-Phase-Noise Oscillator Applications" by V. Kaajakari, IEEE Electron Devices Letters, vol. 25, no 4, April 2004, pages 173 to 175.

In the case of a disk, the frequency $f_{EXT\_D}$ of the extensional mode of a disk is:

$$f_{EXT\_D} = \frac{K}{2R}\sqrt{\frac{E}{\rho}} \quad (2)$$

where K depends on the Poisson's modulus in a given crystallographic direction, R is the radius of the disk, and $\rho$ and E are respectively the density of the material constituting the disk and the Young's modulus for the vibration direction considered.

The frequency $f_L$ of the longitudinal mode of a cantilever beam is:

$$f_L = \frac{1}{4Lp}\sqrt{\frac{E}{\rho}} \tag{3}$$

where Lp is the length of the beam, and ρ and E are respectively the density of the material constituting the beam and the Young's modulus for the vibration direction considered.

In terms of dimensioning, in order to benefit from the advantages mentioned of a resonant anchor with the suspended structure, the aim is therefore to adjust the dimensions of the disk or of the plate and of the anchor beam so as to equalise either both frequencies of formulae (1) and (3), or both frequencies of formulae (2) and (3). However, these analytical formulae depend greatly on the boundary conditions. It is therefore necessary to adjust the dimensions by means of digital simulations based on the Finite Element method.

Figure 1:
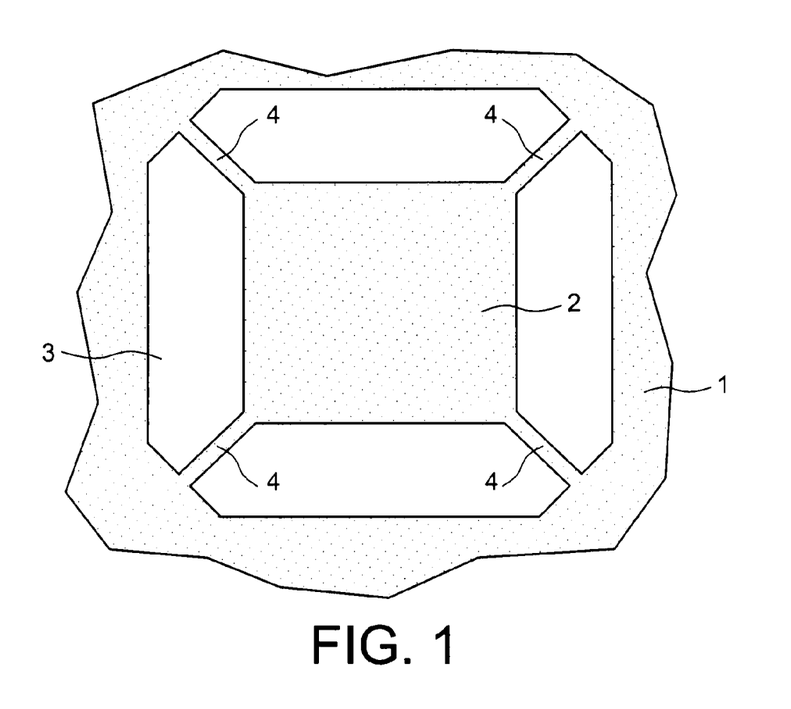
FIG. 1 is a top view of a square plate vibrating in extensional mode with an anchor structure consisting of four beams, according to the invention.

FIG. 1 represents, seen from above, a square plate vibrating in extensional mode with an anchor structure consisting of four beams. A substrate 1 can be recognised in which a suspended structure has been produced consisting of a square plate 2 suspended above a cavity 3, produced in substrate 1, by four beams 4. Square plate 2 and beams 4 are dimensioned so as to satisfy the above formulae (1) and (3).

Figure 2:
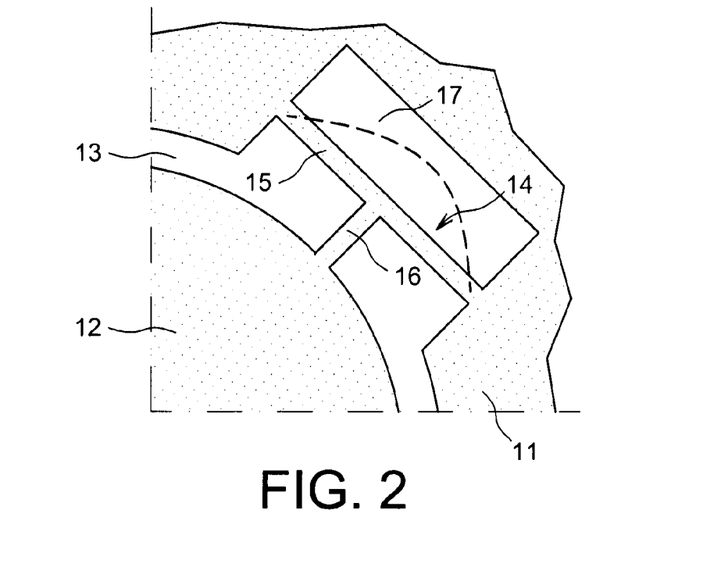
FIG. 2 is a top and partial view of a disk resonating in extensional mode with T-shaped resonant anchors, according to the invention.

2) A Disk or Square Plate Resonating in Extensional Mode with T-Shaped Resonant Anchors It is also possible to use T-shaped anchors to increase still further the effect of impedance mismatch with a transverse bar and in order to produce the least possible resistance to the movement of the suspended structure. To accomplish this the transverse bar of an anchor is dimensioned so as to resonate at its first bending mode, as is shown in FIG. 2, where only one quarter of the suspended structure has been represented.

The frequency fp of the first bending mode of a fixed-fixed beam is:

$$fp = \frac{6,46}{2\pi}\sqrt{\frac{E}{\rho}}\frac{h}{Lp^2} \tag{4}$$

where ρ and E are respectively the density of the material constituting the beam and the Young's modulus for the vibration direction considered, h is the width of the beam in the vibration direction, and Lp is its length.

The aim is therefore to adjust the dimensions of the disk or of the plate and of the transverse fixed-fixed beam, enabling either both frequencies of formulae (1) and (4), or both frequencies of formulae (2) and (4), to be equalised. It should be noted that the second beam connecting the disk or the plate and the transverse beam modifies the intrinsic properties of the transverse beam; a final adjustment must therefore be made to the dimensions by undertaking a finite element simulation of the structure.

FIG. 2, a partial top view, represents a disk resonating in extensional mode with T-shaped resonant anchors. A substrate 11 can be recognised in which has been produced a suspended structure consisting of a disk 12 (only one quarter of which is represented) suspended above a cavity 13, produced in substrate 11, by an anchor structure including four identical elements 14, positioned 90° relative to one another (a single element is represented). Each element includes a transverse fixed-fixed beam 15 in substrate 11 and connected to disk 12 by a beam 16 positioned along a radius of disk 12. Dashed line 17 represents a position of the axis of beam 15 during vibration.

3) A Resonant Disk in its "Wine-Glass" Mode or a Square Plate Resonating in Lamé Mode, Including Anchors Resonating in their First Bending Mode Frequency $f_{WG\_D}$ of the "Wine-Glass" mode of a disk is:

$$f_{WG\_D} = \frac{k}{2\pi R}\sqrt{\frac{E}{\rho(1-v^2)}} \tag{5}$$

where K depends on the Poisson's modulus v in a given crystallographic direction, R is the radius of the disk, and ρ and E are respectively the density of the material constituting the disk and the Young's modulus for the vibration direction considered. The aim is therefore to equalise formula (5) with the formula giving the frequency of a fixed-fixed beam (formula (4) given above).

The frequency $f_{LAME\_P}$ of the Lamé mode of a square plate is:

$$F_{LAME\_P} = \frac{1}{\sqrt{2}\,L}\sqrt{\frac{G}{\rho}} \tag{6}$$

where L is the length of the edge of the plate, G is its shearing modulus and ρ is the density of the material constituting the plate.

The aim is therefore to equalise formula (6) with the formula giving the frequency of a fixed-fixed beam (formula (4) given above).

Figure 3:
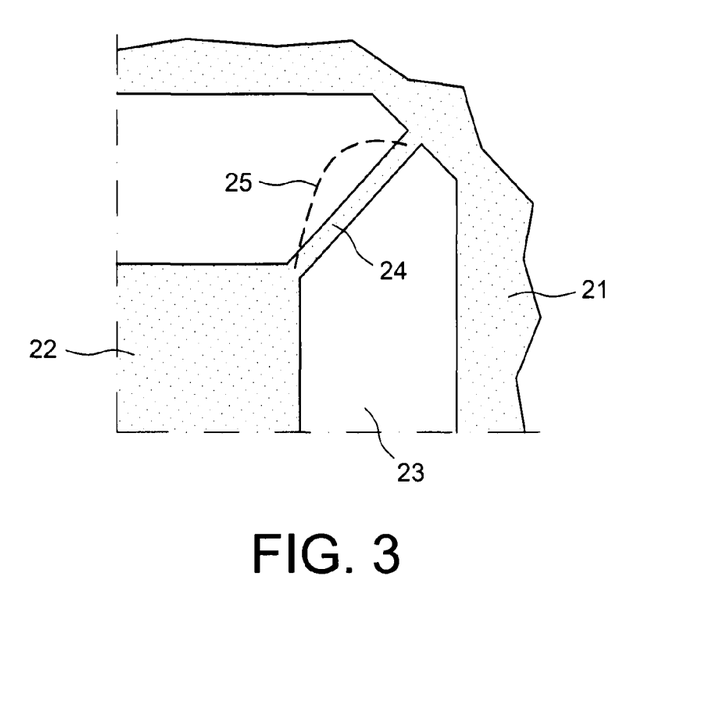
FIG. 3 is a top and partial view of a square plate resonating in its Lamé mode and including anchors resonating in their first bending mode, according to the invention.

FIG. 3 is a top and partial view of a square plate resonating in its Lamé mode and including anchors resonating in their first bending mode. A substrate 21 can be recognised in which has been produced a suspended structure consisting of a disk 22 (only one quarter of which is represented) suspended above a cavity 23, produced in substrate 21, by an anchor structure including four beams 24 connecting the vertices of square plate 22 to substrate 21 (a single beam is represented). Dashed line 25 represents a position of the axis of beam 24 during vibration.

4) A Disk Resonating in its "Wine-Glass" Mode or a Square Plate Resonating in Lamé Mode, with T-Shaped Resonant Anchors Analysis of the "Wine-Glass" and Lamé modes shows that the quasi-nodal points located on the contours of the resonator (where the lateral external anchors are positioned) are not subject to translation, but only to a very slight rotation. The transverse bar of the anchor is dimensioned such that it resonates in its second bending mode (see FIG. 4). In this manner, an additional impedance mismatch is provided, relative to a single anchor. In addition, the middle point of the transverse beam of the T-shaped anchor is held fixed but is believed to facilitate this slight rotation.

The frequency of the second bending mode of a fixed-fixed beam is:

$$fp^2 = \frac{17,8}{2\pi}\sqrt{\frac{E}{\rho}}\frac{h}{Lp^2} \tag{7}$$

where ρ and E are respectively the density of the material constituting the beam and the Young's modulus for the vibration direction considered, h is the width of the beam in the vibration direction, and Lp is its length.

In the case of a suspended structure having the shape of a disk, the aim is therefore to equalise formula (7) with the formula giving the frequency of a disk resonating in its "Wine-Glass" mode (formula (5) given above).

Figure 4:
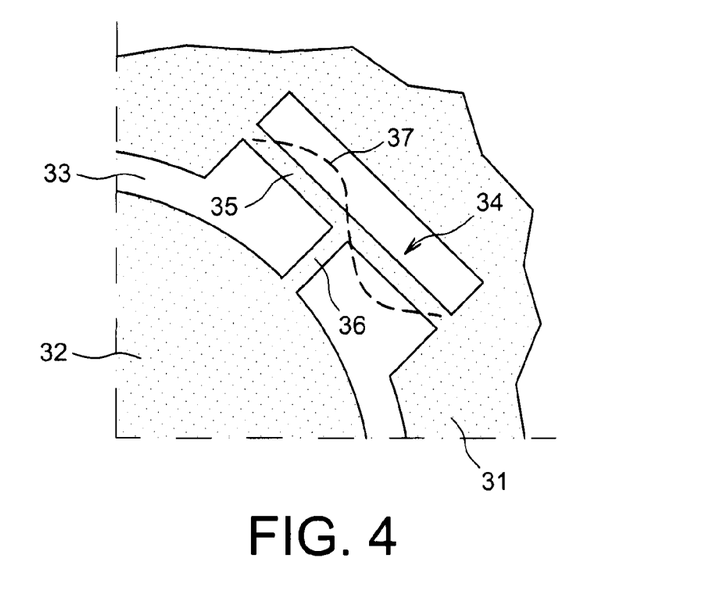
FIG. 4 is a top and partial view of a disk resonating in the "Wine-Glass" mode with T-shaped resonant anchors, according to the invention.

FIG. 4, a partial top view, represents a disk resonating in "Wine-Glass" mode with T-shaped resonant anchors. A substrate 31 can be recognised in which has been produced a suspended structure consisting of a disk 32 (only one quarter of which is represented) suspended above a cavity 33, produced in substrate 31, by an anchor structure including four portions 34, positioned 90° relative to one another (a single portion is represented). Each portion 34 includes a transverse fixed-fixed beam 35 in substrate 31 and connected to disk 32 by a beam 36 positioned along a radius of disk 32. Dashed line 37 represents a position of the axis of beam 35 during vibration.

In the case of a suspended structure having the shape of a plate, the aim is therefore to equalise formula (7) with the formula giving the frequency of a plate resonating in its Lamé mode (formula 6) given above).

5) A Rectangular Plate, of the SiBAR Type, Resonating in its First Quasi-Unidirectional Volume Mode with Anchors Resonating in their Simple Longitudinal Mode The expression SiBAR signifies "Silicon Bulk Acoustic Wave Resonator".

The resonance frequency $f_{SiBAR}$ of the simple longitudinal mode of a rectangular plate is:

$$f_{SiBAR} = \frac{1}{2L}\sqrt{\frac{E}{\rho}} \qquad (8)$$

where L is the length of the plate in the vibration direction, and ρ and E are respectively the density of the material constituting the plate and the Young's modulus for the vibration direction considered.

With respect to the resonance of a plate of this kind, reference may be made to the previously cited article "A low phase noise 100 MHz silicon BAW reference oscillator" by K. Sundaresan et al., IEEE CICC, 10-13 Sep. 2006, pages 841 to 844.

The aim is therefore to equalise formula (8) with the formula giving the frequency of the longitudinal mode of a cantilever beam (formula (3) given above).

Figure 5:
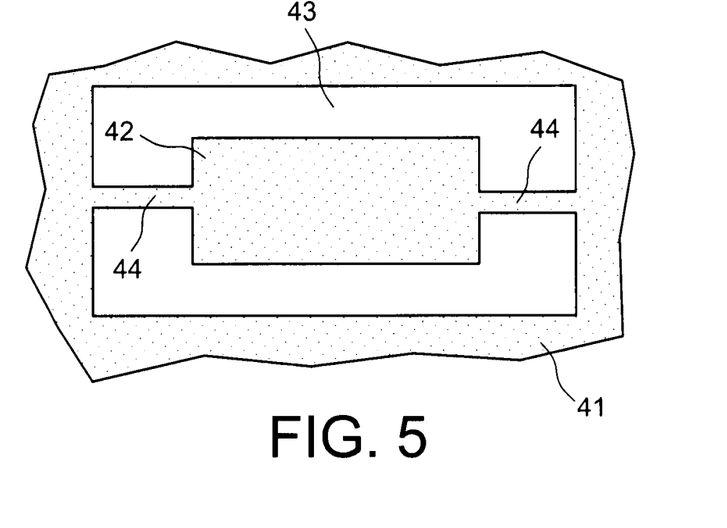
FIG. 5 is a top view of a rectangular plate resonating in its first quasi-directional volume mode with anchors resonating in their simple longitudinal mode, according to the invention.

FIG. 5 represents, as a top view, a rectangular plate resonating in its first quasi-unidirectional volume mode with anchors resonating in their simple longitudinal mode. A substrate 41 may be recognised in which has been produced a suspended structure consisting of a rectangular plate 42 suspended above a cavity 43, produced in substrate 41, by an anchor structure including two beams 44 positioned along the large axis of symmetry of rectangular plate 42.

6) Disk or Square Plate with Tuning Fork Anchor

As resonant structures, tuning forks have the characteristic that they minimise their losses in the anchors. Use of them in combination with a resonant suspended structure therefore also enables a barrier to acoustic propagation to be obtained.

The resonance frequency of a tuning fork is that of an isolated fixed-fixed beam. The aim is therefore to equalise the resonance frequency of a disk or a square plate constituting the suspended structure with the resonance frequency of a tuning fork.

Figure 6:
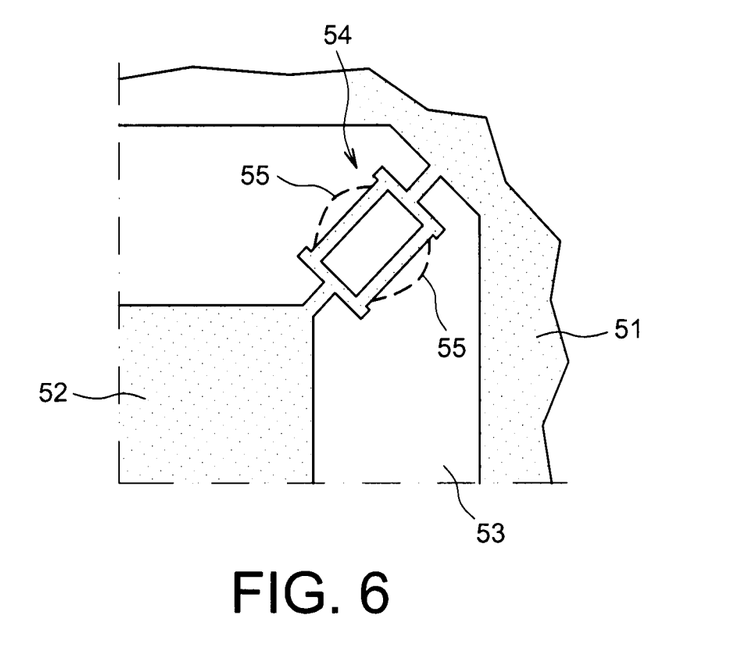
FIG. 6 is a top and partial view of a square plate with an anchor structure formed from a tuning fork, according to the invention.

FIG. 6 represents, as a partial top view, a square plate with an anchor structure formed from tuning forks. A substrate 51 can be recognised in which has been produced a suspended structure consisting of a disk 52 (only one quarter of which is represented) suspended above a cavity 53, produced in substrate 51, by an anchor structure including four identical elements 54 (a single element is represented). Each element 54 includes a tuning fork and connects one vertex of square plate 52 to substrate 51. The dashed lines 55 represent positions of the tuning fork during vibration.

7) A Disk or Square Plate with Slot-Shaped Anchors

Figure 7:
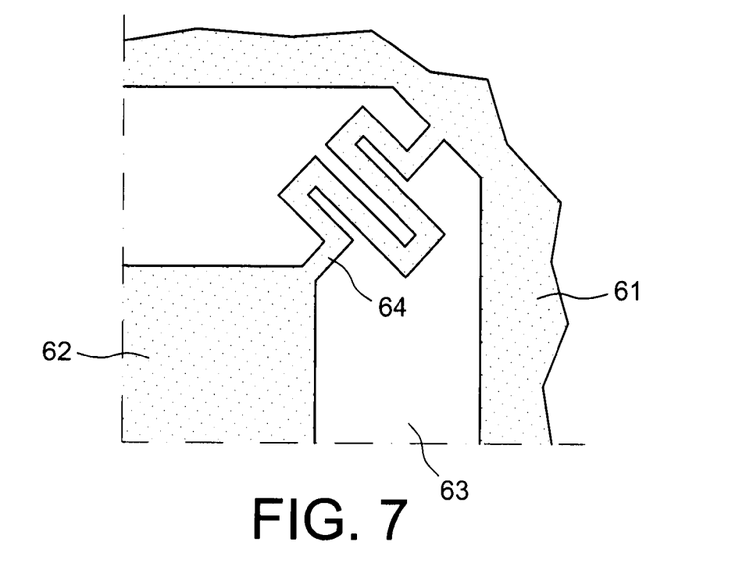
FIG. 7 is a top and partial view of a square plate with anchors in slots, according to the invention.

FIG. 7 represents, as a partial top view, a square plate with slot-shaped anchors. A substrate 61 can be recognised in which has been produced a suspended structure consisting of a disk 62 (only one quarter of which is represented) suspended above a cavity 63, produced in substrate 61, by an anchor structure including four identical elements 64 (a single element is represented). Each resonant element 64 has the shape of a slot or coil or "Greek key", and connects one vertex of square plate 62 to substrate 61.

8) A Ring with Anchors Positioned Beyond the Beam End

Figure 8:
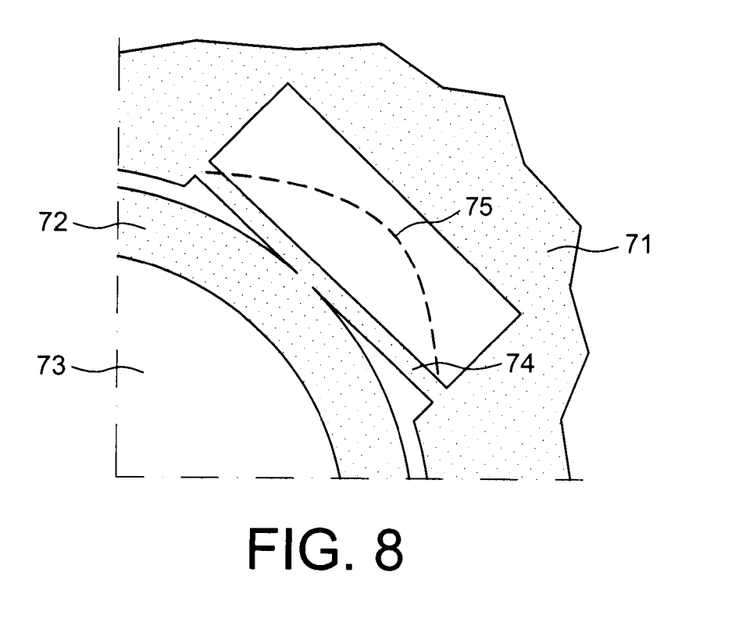
FIG. 8 is a top and partial view of a ring with an anchor beyond the beam ends, according to the invention.

FIG. 8 represents, as a partial top view, a ring with an anchor beyond the beams' ends. A substrate 71 can be recognised in which has been produced a suspended structure consisting of a ring 72 (only one quarter of which is represented) suspended above a cavity 73, produced in substrate 71, by an anchor structure including four beams 74 (a single beam is represented). Each beam 74 is attached in fixed-fixed fashion in the substrate and is positioned to support ring 72 tangentially. Beams 74 are positioned regularly around ring 72. Dashed line 75 represents a position of beam 74 during vibration.

Two manufacturing methods of the invention will now be described. These methods include steps of production of excitation and detection electrodes (by capacitance sensing). The traditional measuring techniques used in the field can be employed. However, any other type of transduction can also be used in the resonators according to the invention.

First Manufacturing Method of the Invention

FIGS. 9A to 9D illustrate a first manufacturing method of the invention. This manufacturing method uses reactive-ion etching (deep RIE).

Figure 9A:
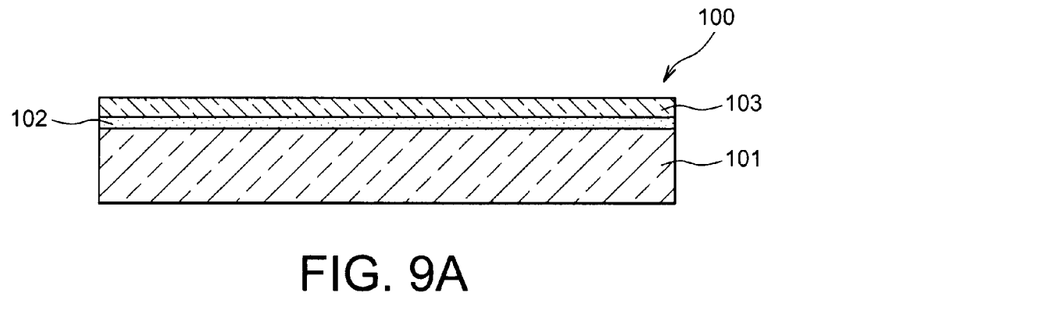
FIGS. 9A to 9D illustrate a first manufacturing method embodiment of the invention.

FIG. 9A shows, seen as a transverse section, a substrate called a semiconductor-on-insulator (SOI) substrate 100 consisting of a support 101 supporting respectively a buried insulator layer 102 and a thin semiconductor material layer 103. As an example, support 101 is made from silicon, buried layer 102 is made from silicon oxide and thin layer 103 is made from monocrystalline silicon. The suspended structure and the anchor structure are produced in thin layer 103. They will be released by sacrificial etching of buried layer 102.

Figure 9B:
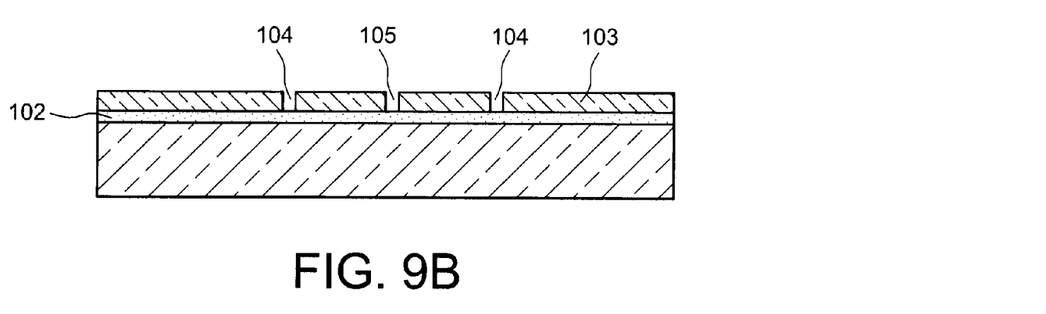

This is followed by a step of photolithography of thin layer 103 and by a step of dry etching of this thin layer, stopping at buried layer 102. The result obtained is shown in FIG. 9B. Channels 104 enable the future suspended structure and the future anchor structure, and possibly all or part of the excitation and detection means (tracks, electrodes), to be demarcated. Hole 105 is a central hole produced in the suspended structure, enabling the etching distance of buried layer 102 to be reduced in the release step.

Figure 9C:
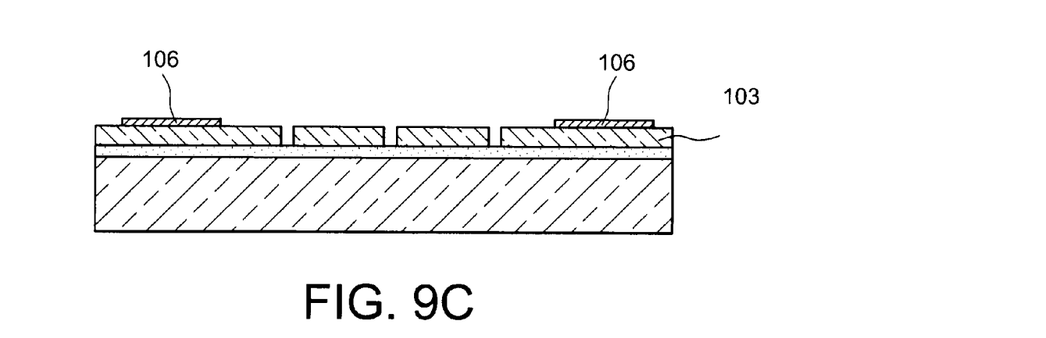
Figure 9D:
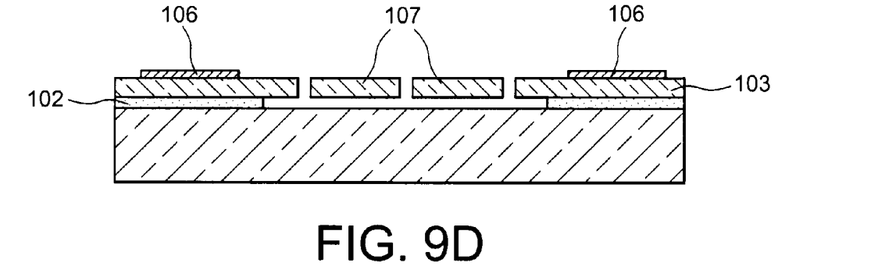

Excitation and detection electrodes are then installed. To accomplish this, the first step is the deposit of a metal layer (for example a layer of AlSi), followed by a step of photolithography of the metal layer, and finally etching of it to produce the electrodes. FIG. 9C shows only two electrodes 106.

The final step consists in partially etching buried layer 102 in order to allow suspended structure 107 (see FIG. 9D) and the anchor structure (not visible in FIG. 9D) to be released.

The silicon oxide layer 102 is, for example, partially etched by hydrofluoric acid (HF) in vapour phase. This partial etching is obtained by restricting the etching time.

Second Manufacturing Method of the Invention

FIGS. 10A to 10G illustrate a second manufacturing method of the invention. This method of manufacture uses an approved sacrificial oxide deposit.

Figure 10A:
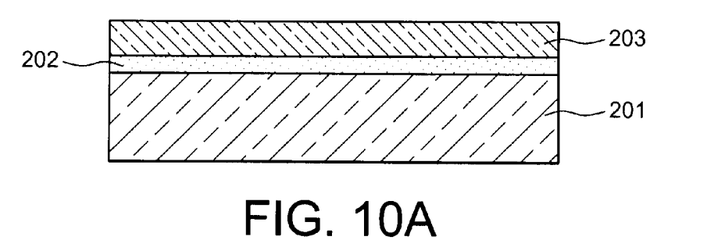
FIGS. 10A to 10G illustrate a second manufacturing method embodiment of the invention.

FIG. 10A shows, seen as a transverse section, a substrate called a semiconductor-on-insulator substrate 200. As an example, as with the first manufacturing method, substrate 200 includes a support 201 made of silicon supporting respectively a buried layer 202 made of silicon oxide and a thin layer 203 made of monocrystalline silicon.

Figure 10B:
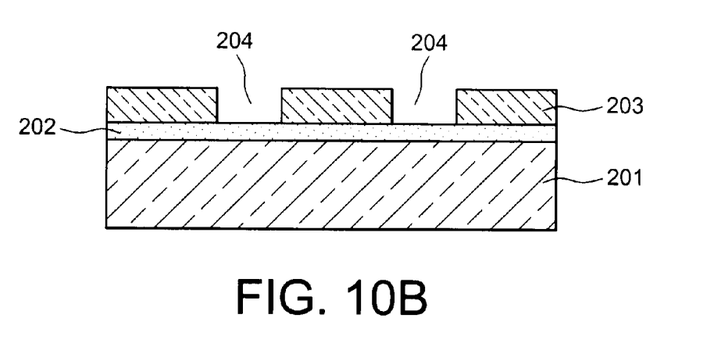
Figure 10C:
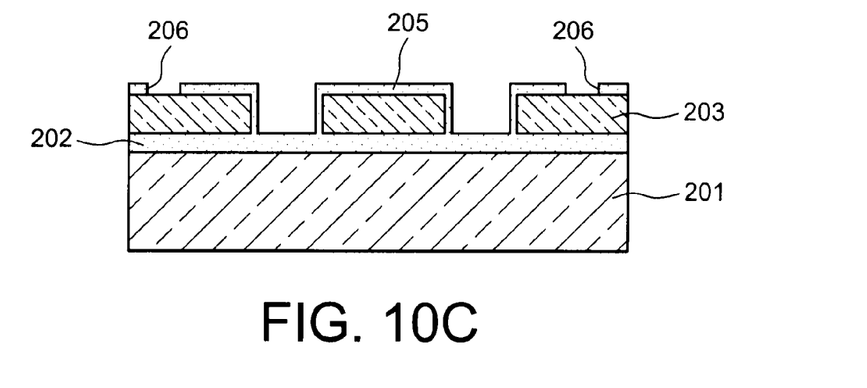

This is followed by a step of photolithography of thin layer 203 and by a step of dry etching of this thin layer, stopping at buried layer 202. The result obtained is shown in FIG. 10B. Channels 204 enable the future suspended structure and the future anchor structure to be demarcated.

After this, an approved fine oxide layer 205 is deposited (see FIG. 10C) on the entire surface of the previously obtained structure. This is, for example, a layer of silicon oxide deposited by the method called chemical vapour deposition (CVD). By photolithography and etching of approved oxide layer 205, orifices are defined which will be used to anchor mechanically and, possibly, to contact electrically the upper layer (207, see below) with thin layer 203. This etching, defining holes 206, has been undertaken as far as to reveal thin layer 203 at the bottoms of holes 206.

Figure 10D:
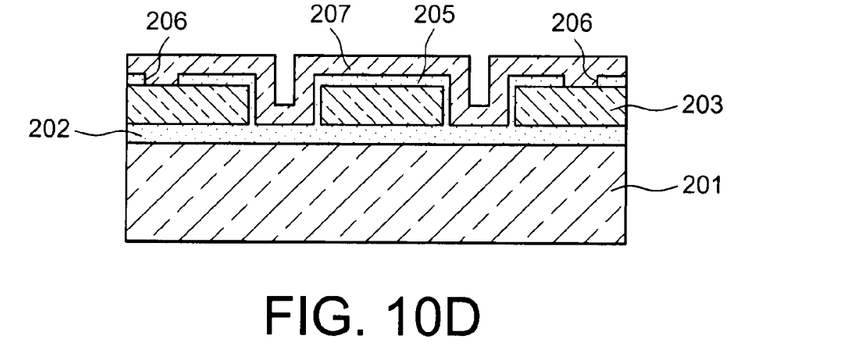

After this an epitaxy of silicon is undertaken on the substrate. This is what is shown by FIG. 10D. A layer of polycrystalline silicon 207 is obtained due to its growth on oxide layer 205. Locally, holes 206 have allowed a growth of monocrystalline silicon in the orifices leading to thin layer 203.

Figure 10E:
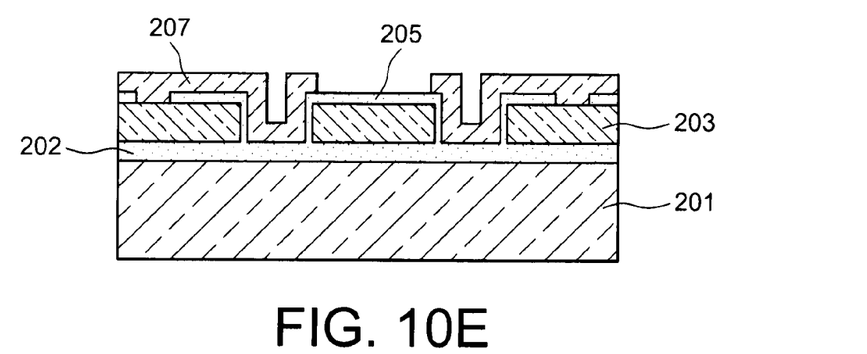

Photolithography of the layer of polycrystalline silicon 207 followed by etching of it are then undertaken in order to prepare for release of the suspended structure and the anchor structure, by giving access to oxide layer 205 located on the suspended structure and anchor structure (see FIG. 10E).

Figure 10F:
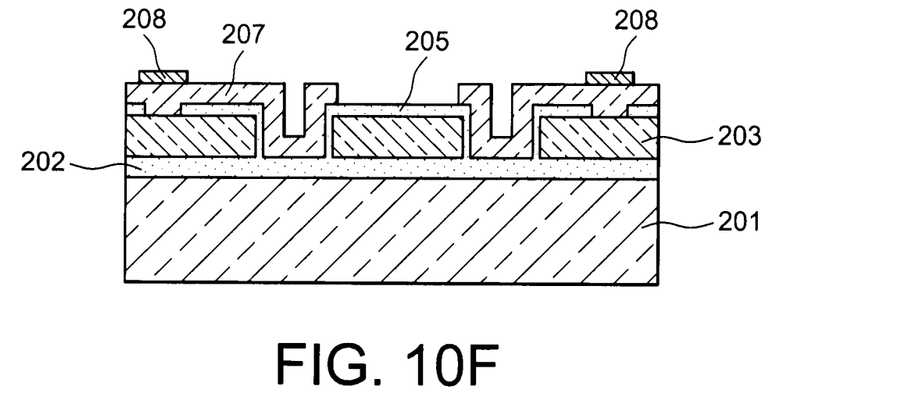

The next step consists in depositing a metal layer on the substrate, in photolithographing and etching it, in order to obtain metal contacts (see FIG. 10F).

Figure 10G:
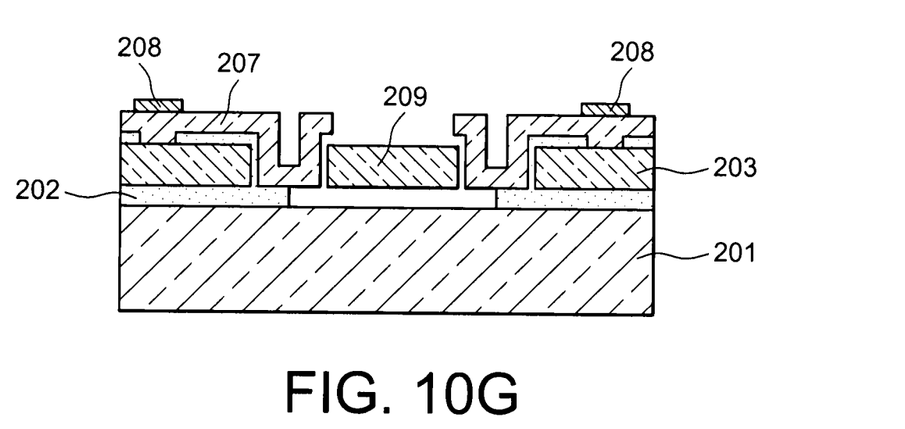

The silicon oxide is then etched by hydrofluoric acid (HF) in vapour phase. The etching starts on the free face of approved fine oxide layer 205, i.e. in the position of the future suspended structure and the future anchor structure. It is continued until the suspended structure and the anchor structure are fully released (see FIG. 10G). In FIG. 10G, only suspended structure 209 can be seen.

The invention claimed is:

1. An electromechanical resonator produced on a substrate, comprising:
    a suspended structure produced at least partly from a layer of the substrate, configured to be vibrated to resonate in Lamé mode or in wine-glass mode at at least one natural resonance frequency of the suspended structure;
    an anchor structure to anchor the suspended structure, by at least one area of its periphery, to a remainder of the substrate, wherein the anchor structure is dimensioned to resonate at the resonance frequency, or at a frequency that is a multiple of the resonance frequency;
    means for exciting the suspended structure, to cause it to vibrate at the resonance frequency; and
    means for detecting the vibration frequency of the suspended structure, wherein
    the anchor structure includes at least one T-shaped element formed from the layer of the substrate as a first fixed-fixed beam, which resonates at the resonance frequency, or at the frequency that is a multiple of the resonance frequency, and a second beam, a first end of which is coupled with the first beam, and a second end of which is coupled with the suspended structure, and wherein
    the first end of the second beam is coupled with the first beam at a node of vibration of the first beam, and the second end of the second beam is coupled with the suspended structure at a nodal point of the suspended structure.

2. An electromechanical resonator according to claim 1, in which the suspended structure is a structure chosen from among a disk, a square plate, a rectangular plate, a ring, and an ellipse.

3. An electromechanical resonator according to claim 2, in which the suspended structure is a disk or an ellipse resonating in its wine-glass mode.

4. An electromechanical resonator according to claim 2, in which the suspended structure is a square or rectangular plate resonating in its Lamé mode.

5. An electromechanical resonator according to claim 1, in which the length of the second beam is between 0 and half the length of the first beam.

6. A method of manufacture of an electromechanical resonator according to claim 1, configured to operate at a given resonance frequency, the method comprising:
    selecting a shape of the suspended structure;
    selecting dimensions of the suspended structure so that one of its natural modes is the given resonance frequency;
    selecting a shape and position of the anchor structure configured to resonate at the given resonance frequency;
    modelling the suspended structure and the anchor structure, to determine dimensions of the anchor structure considered, so that both the structures may resonate at the same frequency; and
    manufacturing the resonator using the data supplied in the previous selecting and modelling.

* * * * *